United States Patent [19]

Satoh

[11] Patent Number: 5,207,865

[45] Date of Patent: May 4, 1993

[54] MULTILAYER STRUCTURE AND METHOD FOR FABRICATING THE SAME

[75] Inventor: Kazuaki Satoh, Hachioji, Japan

[73] Assignee: Fujitsu Limited, Kawasaki, Japan

[21] Appl. No.: 666,710

[22] Filed: Mar. 8, 1991

[30] Foreign Application Priority Data

Mar. 19, 1990 [JP] Japan .................................. 2-69133

[51] Int. Cl.⁵ ........................ B44C 1/22; B29C 37/00; C23F 1/00
[52] U.S. Cl. .................... 156/643; 156/655; 156/656; 156/659.1; 156/668; 156/644; 156/902; 29/852; 29/874; 428/209; 428/901
[58] Field of Search ............... 156/643, 650, 655, 656, 156/659.1, 661.1, 666, 668, 901, 902, 644; 428/195, 209, 901; 204/15; 29/846, 852, 874; 427/97; 174/250, 261, 262, 265, 266; 361/380, 403–406, 417, 418

[56] References Cited

U.S. PATENT DOCUMENTS

| | | | |
|---|---|---|---|
| 4,917,759 | 4/1990 | Fisher et al. ................. | 156/643 |
| 4,970,106 | 11/1990 | Distefano et al. ............ | 428/209 |
| 4,983,250 | 1/1991 | Pan ............................... | 156/668 X |

FOREIGN PATENT DOCUMENTS

| | | |
|---|---|---|
| 0099544 | 2/1984 | European Pat. Off. . |
| 0329969 | 8/1989 | European Pat. Off. . |
| 0346617 | 12/1989 | European Pat. Off. . |
| 3522852 | 1/1987 | Fed. Rep. of Germany . |

OTHER PUBLICATIONS

6th IEEE/CHMT International Electronic Manufacturing Technology Symposium, Apr. 26, 1989, NARA, JP pp. 128–131; N. Iwasaki et al.: "A pillar-shaped via structure in a cu-polyimide multilayer substrate".

IBM Technical Disclosure Bulletin, vol. 20, No. 9, Feb. 1978, New York US, pp. 3443–3444; M. M. Haddad: "Selectively electroplating pad terminals on an MLC substrate."

IBM Technical Disclosure Bulletin, vol. 32, No. 6B, Nov. 1989, New York US, pp. 326–327; "Additive plating on chromium for circuitizing non-epoxy substrates."

Primary Examiner—William A. Powell
Attorney, Agent, or Firm—Staas & Halsey

[57] ABSTRACT

A multilayer structure is fabricated by forming a conductive layer on an insulative substrate. A first conductive pattern is formed on the first conductive layer and a resist layer having a via hole therethrough is formed on the first pattern. A via lead is formed in the via hole by electrically plating a metal therein utilizing the first layer as a lead for the plating process. The resist and the exposed part of the first layer ar removed and a polyimide layer having a thermal expansion coefficient that is equal to that of the via lead is formed over the substrate. The surface of the polyimide layer is etched until the via lead top segment protrudes to a predetermined height above the surface of the etched polyimide layer. A second pattern is formed on the polyimide layer and the exposed lead segment by a plating process.

12 Claims, 6 Drawing Sheets

MULTILAYER STRUCTURE AND METHOD FOR FABRICATING THE SAME

BACKGROUND OF THE INVENTION

1. Field of the Invention

The present invention is related to a multilayer structure employed in hybrid IC (integrated circuit) or semiconductor devices, etc. More particularly, the invention is related to a reliable method and means for electrically interconnecting conductive layers having an insulative resin layer disposed therebetween.

2. Description of the Related Arts

Many kinds of multilayer structures and fabrication methods have been employed for fabricating hybrid ICs (integrated circuits) and semiconductor devices. A typical structure and manufacturing method are described in Japanese Unexamined Patent Publication Sho-63-244796 and shown here in FIG. 1. In accordance with this method, a wiring pattern 31 is formed on a first electrically conductive copper layer 38 that is disposed on an insulative glass substrate layer 37. The wiring pattern 31 is formed using a first resist pattern 32. A second resist pattern 33 having a hole 34 located above wiring pattern 31 is formed on resist pattern 32 (FIG. 1a) and a pillar 35 is formed in hole 34 by an electroplating. The first and second resist patterns 32 and 33 are removed and then a polyimide resin layer 36 (FIG. 1b) is formed over pillar 35, wiring pattern 31 and conductive layer 38. The top of pillar 35 is exposed by polishing or etching the surface of the polyimide resin layer 36 and a second electrically conductive layer 38′ (FIG. 1c) and a second wiring pattern 31′ (FIG. 1d) are formed over polyimide resin layer 36 and the top of pillar 35.

The spirit of this prior art structure is to flatten the top of pillar 35 as can be comprehended from the foregoing description and from FIGS. 1(b) and 1(c). However, when the top of the pillar is flat the electrical contact between the pillar top and electrically conductive layer 8 is not strong enough to withstand the mechanical stresses resulting from heating cycles, etc. This presents a possibility that the connection will break resulting in a deterioration in the reliability of the electrical connection between the multiple layers. Moreover, if the pillar top is flattened by mechanically polishing the surface of insulative layer 36, the polishing operation is very difficult because the substrate might have a tendency to bend due to the presence of the polyimide resin coating.

SUMMARY OF THE INVENTION

It is a general object of the invention to provide a multilayer structure and method for fabricating such structure wherein two patterns isolated by an insulative layer therebetween are reliably electrically interconnected It is another object of the invention to provide a multilayer structure and a method for fabricating such structure wherein the improved flatness of each wiring pattern allows for a greater number of layers in the overall structure.

A multilayer structure is fabricated by first forming a first electrically conductive layer on an insulative substrate. A first electrically conductive pattern is then formed on the substrate. A resist pattern is formed over the first layer and the first pattern and the resist layer is provided with a via hole therethrough which communicates with the first pattern. A via lead is formed in the via hole by depositing a metal material in the via hole by electroplating utilizing the first layer as an electroplating lead. A predetermined portion of the first layer and all of the resist pattern are removed and an insulative resin layer is formed over the substrate, the first pattern and the via lead. The surface portion of the resin layer is removed chemically until the top segment of the via lead protrudes to a predetermined height above the surface of the resin layer. A second electrically conductive layer is formed over the resin layer and over the top of the via lead and a second pattern is formed on the second layer. The above steps are repeated for fabricating the required number of layers for the multilayer structure.

The above-mentioned features and advantages of the present invention, together with other objects and advantages which will become apparent, will be more fully described hereinbelow, with reference being made to the accompanying drawings which form a part of the description. In the drawings, like numerals refer to like parts throughout.

A BRIEF DESCRIPTION OF THE DRAWINGS

FIGS. 1(a) through 1(d) schematically illustrate the fabrication steps for a prior art multilayer structure; and FIGS. 2(a) through 2(q) schematically illustrate the fabrication steps of a preferred embodiment of the present invention, and wherein FIG. 2(q) schematically illustrates a completed three-layer structure.

DESCRIPTION OF THE PREFERRED EMBODIMENTS

Figure 1A:
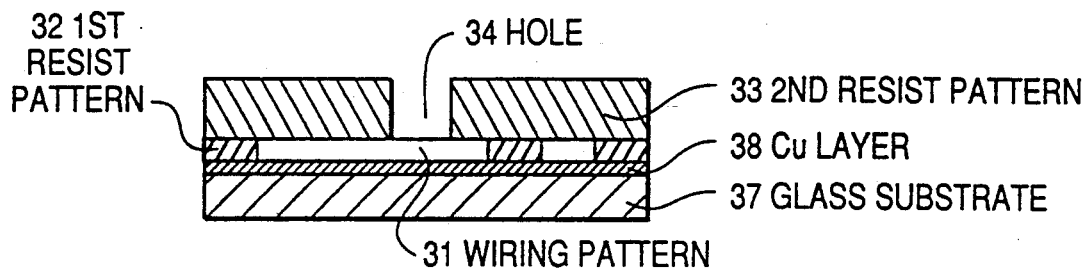
Figure 1B:
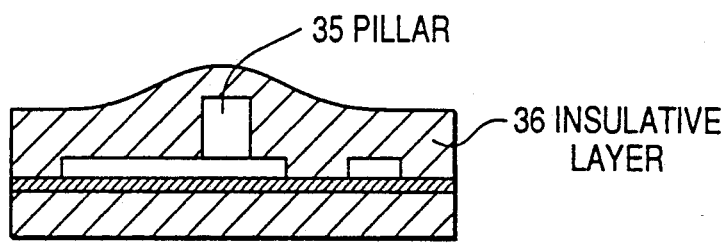
Figure 1C:
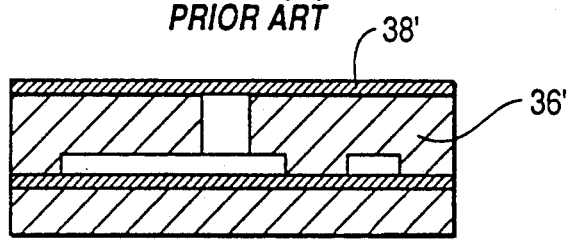
Figure 1D:
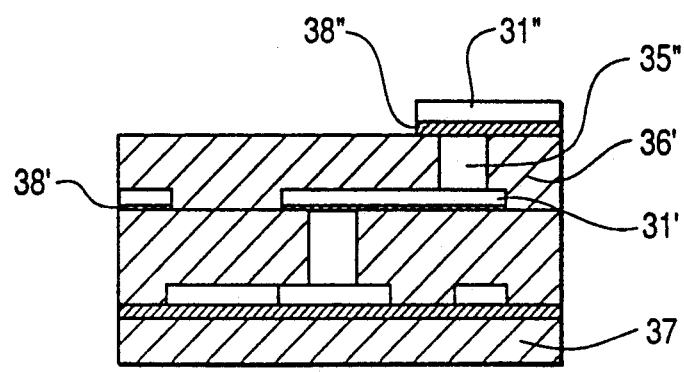
Figure 2A:
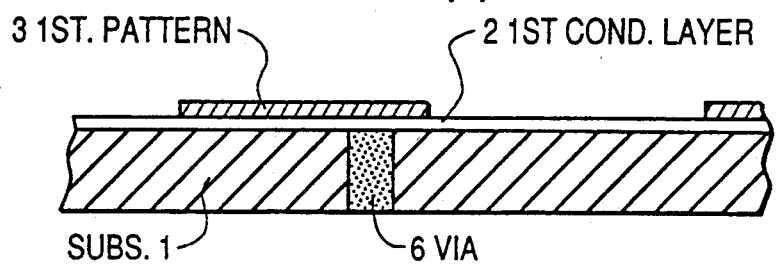

A preferred embodiment of a multilayer structure of the present invention is hereinafter described with reference to the fabrication steps shown in FIGS. 2(a) through 2(q). With reference to FIG. 2(a), a first electrically conductive layer 2 is formed upon a surface of an insulative substrate 1 which is formed, for example, of a ceramic material, by depositing electrically conductive materials. Layer 2 is formed such as a chromium film having a thickness of 1500 angstroms, a titanium film having a thickness of 500 angstroms and a copper film having a thickness of 10000 angstroms on substrate 1. Next, an electrically conductive pattern 3 is formed on by depositing thereon, for example, a 5 μm thick copper layer, a 2 μm thick nickel layer and a 1500 angstrom chromium layer using known electroplating methodology. In such electroplating process, the first electrically conductive layer 2 can be utilized as an electrical lead for the electroplating process. In this preferred embodiment, ceramic substrate 1 has been provided in advance with a via lead 6 which extends through substrate 1 at a predetermined location, whereby pattern 3 is provided with an electrical connection which is led out to the rear of substrate 1.

Figure 2B:
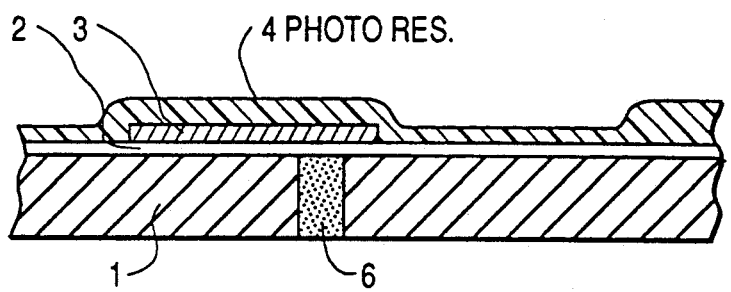

As can be seen in FIG. 2(b), first electrically conductive layer 2 and first pattern 3 are coated with a photosensitive resist layer 4 having a predetermined thickness, for example, of approximately 20 μm.

Figure 2C:
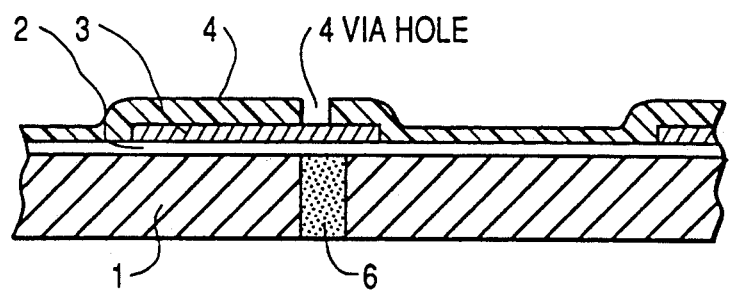

With reference to FIG. 2(c), it can be seen that a via hole 4A having a diameter of approximately 80 μm is provided at a predetermined location in photosensitive resist layer 4, above first pattern, using a known method such as light exposure, developing and etching. As can be seen, hole 4A communicates with the upper surface of pattern 3.

Figure 2D:
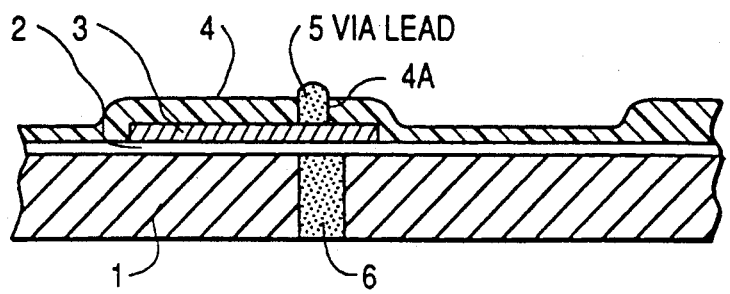

With reference to FIG. 2(d), copper is electroplated to a thickness of approximately 25 μm in via hole 4A so as to form a via lead 5 therein. This electroplating process is carried out under carefully controlled plating conditions such that a brightener is added in the plating solution and the current density is typically 5 to 10 A/cm$^2$, so that an excellent leveling effect is achieved and lead 5 is provided with high tensile strength as well as low electrical resistance.

Figure 2E:
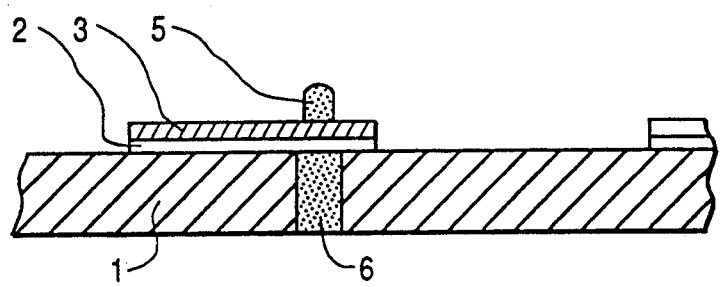

FIG. 2(e) illustrates the next step where photo resist 4 is removed completely and first electrically conductive layer 2 is removed except for the portion thereof which is beneath first pattern 4.

Figure 2F:
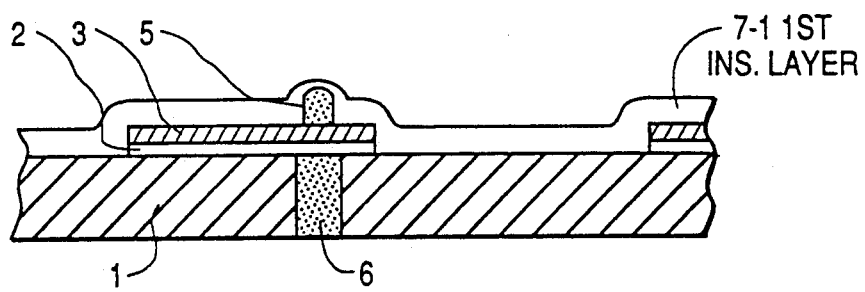
Figure 2G:
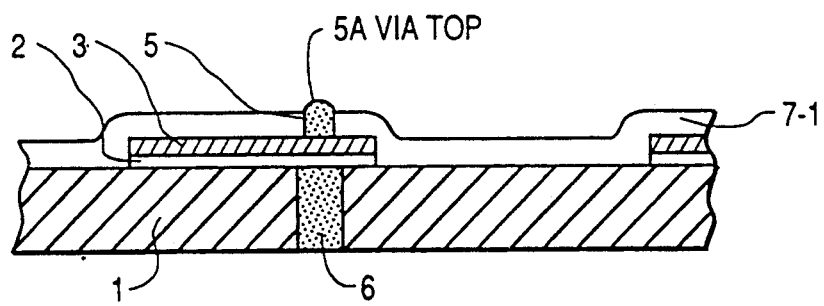

As illustrated in FIG. 2(f), a coating 7-1 of a non-photosensitive resin, such as polyamic acid resin, is coated over substrate 1, first pattern 3 and via lead 5. Thereafter the resin coating is heating at 350 to 450 degrees C. for 30 to 60 minutes, so that the resin hardens and coating 7-1 becomes a first insulative polyimide resin layer 7-1. The coating conditions, such as the viscosity of the polyamic acid resin, are adjusted so that the coating thickness is approximately 22 μm at flat areas of the structures, and 0.5 to 0.8 μm over the top of via lead 5 which has a height of 25 μm Thereafter, with reference to FIG. 2(g), the surface of first insulative layer 7-1 is removed using the known RIE (reactive ion etching) procedure or an ion milling technique employing oxygen (O$_2$) and tetrafluoride carbon (CF$_4$) as etchants, until the top segment 5A of via lead 5 is exposed to a height of 3 to 5 μm above the surface of first insulative layer 7-1. During this etching process, the selected etchants do not react with the metal of via lead 5.

Figure 2H:
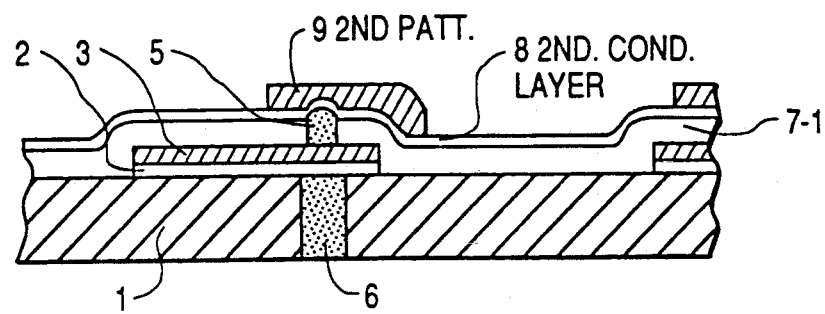

As can be seen in FIG. 2(h), a second electrically conductive layer 8 and a second pattern 9 are formed over first insulative layer 7-1 as well as over the exposed via top segment 5A in the same way that the first electrically conductive layer 2 and first pattern 3 were initially formed over substrate 1. The plating conditions can be chosen from among a number of widely known techniques so as to provide excellent adhesion between the layers as well as a leveling effect so that the thickness of layer 8 and pattern 9 over the via top segment 5A are less than at other flatter portions of the structure. As a result, the upper surface of the thus formed second pattern 9 can be relatively flat even over the 3 to 5 μm protrusion of via top segment 5A. Furthermore, the 3 to 5 μm protrusion of via top segment 5A provides a non-flat shape, which distributes the stresses generated at the contact borders and provides a wider area of contact with the pattern 9 plated thereover than was provided by the flat top of the pillar 35 of the prior art. As a result of the favorable shape of via top segment 5A and favorable plating conditions, first pattern 3 and second pattern 9 are more securely connected by via lead 5.

As described above in connection with FIG. 2(f) the polyamic acid resin first adheres to the via lead 5, and then the polyamic acid resin is hardened by heat so as to become a polyimide resin. Thus, the adhesion between the via lead 5 and the resin 7-1 is excellent. On the other hand, in the prior art structure where the via and the upper pattern are concurrently plated in a previously provided via hole in the insulative layer, there can be no adhesion between the via lead and the insulative layer.

Moreover, in the above-described structure and fabrication method, first insulative layer 7-1 does not need to be photosensitive. Accordingly, a polyimide resin which has a thermal expansion coefficient that is substantially equal to that of via 5 can be employed since many kinds of non-photosensitive polyimide resins having a variety of thermal expansion coefficients are available. Therefore, the problem which is encountered when a photosensitive polyimide resin is employed as an insulative layer, in that the stresses generated in the insulative layer cause separation of the pattern from the via lead, does not exist in the device and method of the present invention. These factors together with the abovedescribed secure connection between the via lead and the pattern prevent breaking of the connection between the via and the pattern and contribute to the enhancement of reliability of the connections.

Figure 2I:
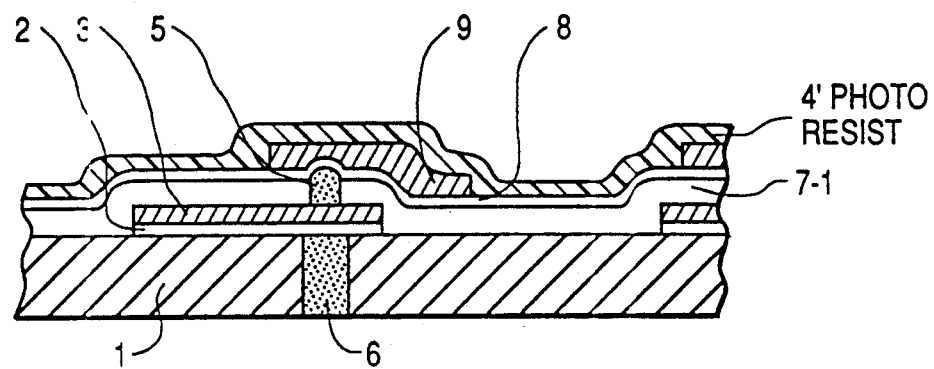

If a third pattern is to be fabricated over second pattern 9, the processes described above are repeated. That is to say, as seen in FIG. 2(i) a photoresist 4' is coated over the second electrically conductive layer 8 and the second pattern 9.

Figure 2J:
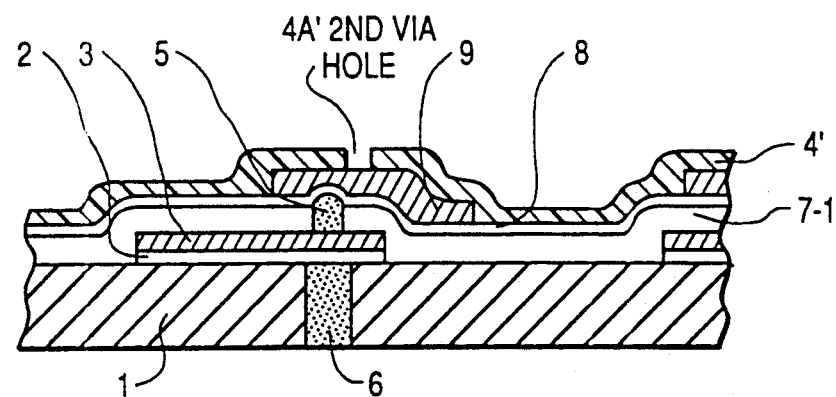

Next, as seen in FIG. 2(j), a second via hole 4A' is etched out at a predetermined place in photoresist 4'.

Figure 2K:
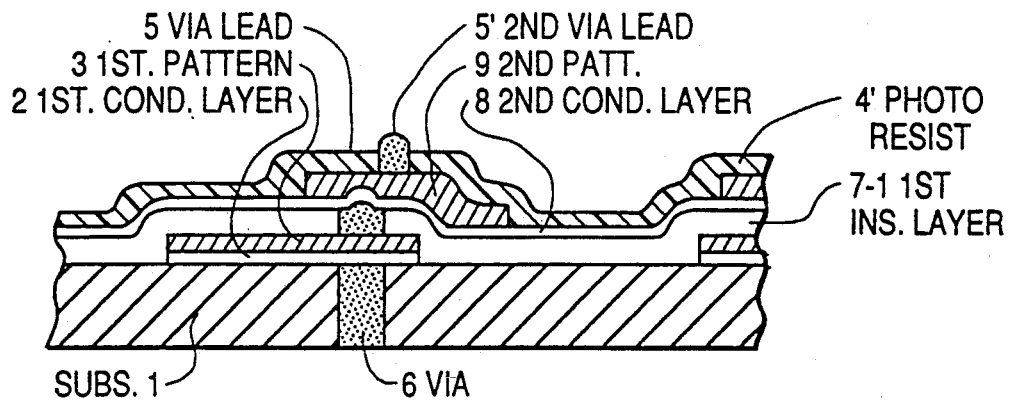

With reference to FIG. 2(k), copper is electroplated in second via hole 4A' 50 as to form a second via lead 5' on first pattern 9 by utilizing second electrically conductive layer 8 as a lead for the electroplating procedure.

Figure 2L:
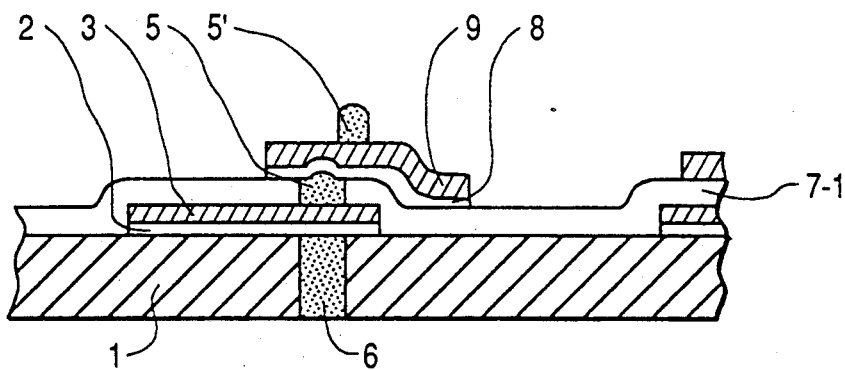

Photoresist 4' is removed completely and second electrically conductive layer 8 is removed in all areas except for the areas beneath second pattern 4', as can be seen in FIG. 2(l).

Figure 2M:
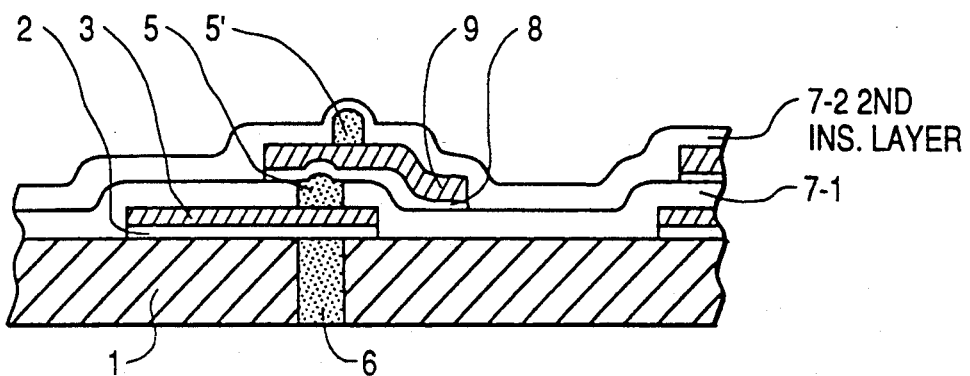

As illustrated in FIG. 2(m) polyamic acid resin is coated over first insulative layer 7-1 and second pattern 9, and is then heated to become polyimide resin and present a second insulative layer 7-2.

Figure 2N:
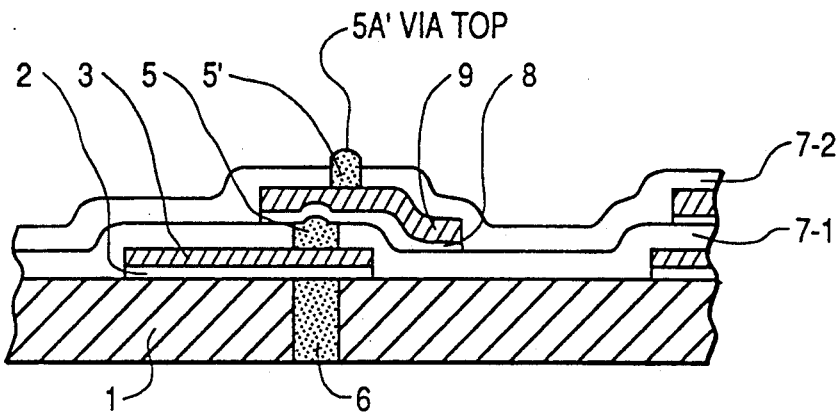

FIG. 2(n) shows the next step where the surface of second insulative layer 7-2 is removed so as to expose 3 to 5 μm of the top segment 5A' of second via lead 5'.

Figure 2P:
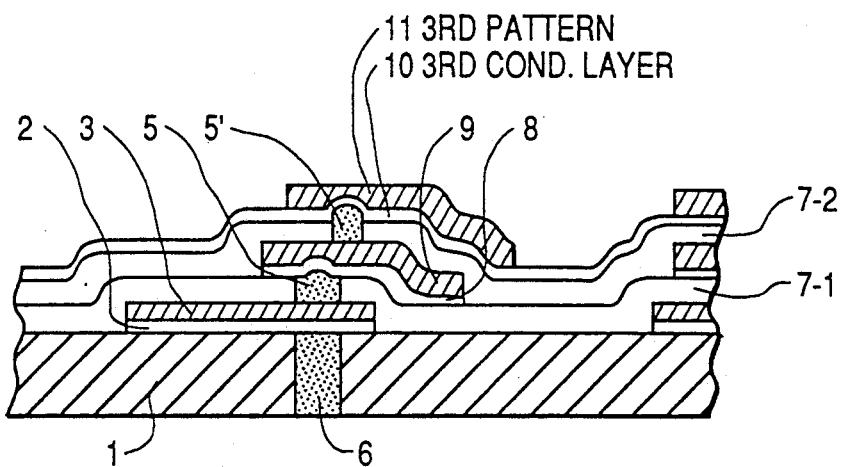

As shown in FIG. 2(p), a third electrically conductive layer 10 and a third pattern 11 are formed over second insulative layer 7-2 and over the exposed via top segment 5A'.

Figure 2Q:
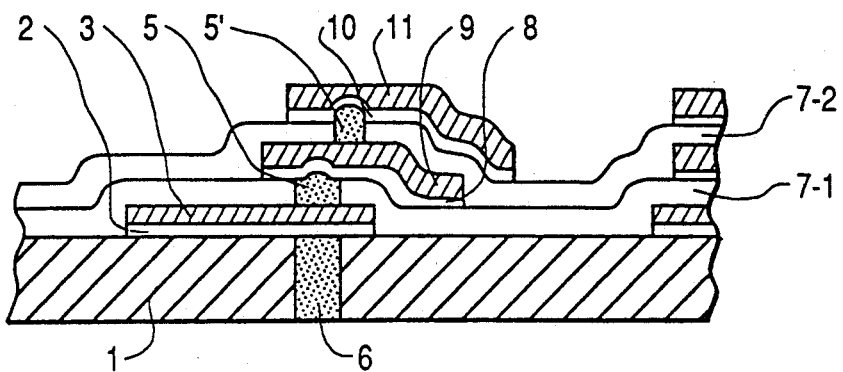

Finally, as illustrated in FIG. 2(q), third electrically conductive layer 10 is removed except for the portion thereof beneath third pattern 11.

Thus, a multilayer structure having a second pattern which is connected to a first pattern and a third pattern which is, and third pattern connected to the second pattern, by via leads 5 and 5' respectively, is shown in FIG. 2(q).

If a fourth pattern is required, layer 10 is not removed and instead the above-described steps as illustrated in FIGS. 2(i) through 2(q), are repeated. By repetition of the above-described steps, as many layers as required can be stacked, causing no problems in reliability or deterioration due to non flat surfaces of the layers, because the patterns are adequately flat even when plated over the via top segments 5A and 5A'. The thicknesses of the various layers in FIGS. 2(a) through 2(q) are shown enlarged; therefore, the figures do not show the real flatness.

In the above description of the preferred embodiment, the first, second and third patterns 3, 9 and 11 are described as being formed as copper, nickel and chromium laminations however, it is apparent that other metals, such as gold, chromium/gold laminations, or chromium/platinum laminations are applicable for forming the layers of the invention. Chromium surfaces provide excellent adhesion with polyimide resin.

In the above description of the preferred embodiment, the first, second and third electrically conductive layers 2, 8 and 10 are described as being formed as chromium, titanium and copper laminations. However, it is apparent that the layers may also be formed of other metals, such as titanium/copper laminations, titanium, tungsten and copper laminations or tantalum, nickel and copper laminations, in the present invention.

In the above description of the preferred embodiment, first pattern 3 is formed over first electrically conductive layer 2. However, it is apparent that first electrically conductive layer 2 might as well be formed over first pattern 3 which has been formed directly on substrate 1. In this case the via lead 5 of the invention will be formed on the first electrically conductive layer 2.

In the above description of the preferred embodiment, the first and second insulative layers 7-1 and 7-2 are formed of polyimide resin. However, it is apparent that the insulative layers might also be formed of other insulative materials, such as a fluororesin.

In the above description of the preferred embodiment, substrate 1 has a via lead 6 therein which has been provided in advance. However, it is apparent that the invention can be embodied in a structure having a substrate that has no via lead therein. On the other hand, the first pattern 3 and the via lead 5 may be formed by electroplated using the via lead 6 as a lead for the plating operation in cases where first electrically conductive layer 2 is deleted.

The many features and advantages of the invention are apparent from the foregoing detailed specification and it is intended by the appended claims to cover all such features and advantages which fall within the true spirit and scope of the invention. Further, since numerous modifications and changes will readily occur to those skilled in the art, the description is not intended to limit the invention and accordingly, all suitable modifications or equivalents falling within the scope of the invention or intended to be covered.

What I claim is:

1. A method of fabricating a multilayer structure, comprising the steps of:
   forming a first electrically conductive layer on an insulative substrate;
   forming a first electrically conductive pattern on said first layer;
   forming a resist layer over said first layer and said first pattern, said resist layer having a via hole therethrough communicating with said first pattern;
   forming a conductive via lead in said via hole by electrically plating a metal therein utilizing said first layer as an electroplating lead during said plating operation, said conductive via lead thereby being formed in electrical contact with said first pattern;
   removing said resist layer;
   removing a predetermined portion of said first layer;
   coating an insulative resin layer over said substrate, said first pattern and said via lead;
   etching the surface of said resin layer at a location adjacent said via lead to selectively remove the resin layer until a top segment of said via lead protrudes to a predetermined height above the etched surface of said resin layer; and
   forming a second electrically conductive pattern over said resin layer and over the protruding top segment of said via lead.

2. A method of fabricating a multilayer structure as set forth in claim 1, wherein said insulative resin layer is formed from a non-photosensitive material.

3. A method of fabricating a multilayer structure as set forth in claim 1, wherein said insulative layer is formed from a polyimide resin material.

4. A method of fabricating a multilayer structure as set forth in claim 1, wherein said insulative layer has a thermal expansion coefficient that is substantially equal to the thermal expansion coefficient of the metal from which said via lead is formed.

5. A method of fabricating a multilayer structure as set forth in claim 1, wherein during said coating step said insulative layer is formed so that it is substantially thinner on top of said top segment of said via lead than at other portions of the structure.

6. A method of fabricating a multilayer structure as set forth in claim 1, wherein during said etching step said insulative resin is removed by chemical etching.

7. A method of fabricating a multilayer structure as set forth in claim 6, wherein said chemical etching comprises reactive ion etching or ion milling.

8. A method of fabricating a multilayer structure as set forth in claim 1, wherein said second electrically conductive pattern is formed by electrical plating.

9. A method of fabricating a multilayer structure, comprising the steps of:
   forming a first electrically conductive pattern on an insulative substrate having a first electrically conductive via lead extending therethrough for electrically connecting components on opposite sides of said substrate;
   forming a resist layer over said substrate and said first pattern, said resist layer having a via hole therethrough communicating with said first pattern;
   forming a second electrically conductive via lead in said via hole by electrically plating a metal therein utilizing said first via lead as an electroplating lead during said plating operation, said second via lead being formed in electrical contact with said first pattern;
   removing said resist layer;
   coating an insulative resin layer over said substrate, said first pattern and said second via lead;
   etching the surface of said resin layer at a location adjacent said second via lead to selectively remove the resin layer until a top segment of said second via lead protrudes to a predetermined height above the etched surface of said resin layer; and
   forming a second electrically conductive pattern over said resin layer and over the protruding top segment of said second via lead.

10. A method of fabricating a multilayer structure, comprising the steps of:
    forming a first electrically conductive pattern on an insulative substrate;
    forming a first electrically conductive layer on said first pattern;
    forming a resist layer over said first layer, said resist layer having a via hole therethrough communicating with said first layer;
    forming a conductive via lead in said via hole by electrically plating a metal therein utilizing said first layer as an electroplating lead during said plating operation, said conductive via lead thereby being formed in electrical contact with said first layer;

removing said resist layer;

removing a predetermined portion of said first layer;

coating an insulative resin layer over said substrate, a residual portion of said first layer and said via lead;

etching the surface of said resin layer at a location adjacent said via lead to selectively remove the resin layer until a top segment of said via lead protrudes to a predetermined height above the etched surface of said resin layer; and forming a second electrically conductive pattern over said resin layer and over the protruding top segment of said first via lead.

11. A method of fabricating a multilayer structure, comprising the steps of:

forming a first electrically conductive pattern on an insulative substrate;

forming a resist layer over said substrate and over said first pattern, said resist layer having a via hole therethrough communicating with said first pattern;

forming a conductive via lead in said via hole by electrically plating a metal therein, said conductive via lead being formed in electrical contact with said first pattern;

removing said resist layer;

forming an insulative resin layer over said substrate, said first pattern and said via lead;

etching the surface of said resin layer at a location adjacent said via lead to selectively remove the resin layer until a top segment of said via lead protrudes to a predetermined height above the etched surface of said resin layer; and forming a second electrically conductive pattern over said resin layer and over the protruding segment of said via lead.

12. A method of fabricating a multilayer structure as set forth in claim 11, further comprising the steps of:

forming a second insulative resin layer over said second pattern and said first mentioned resin layer;

forming a second electrically conductive pattern on said second insulative resin layer;

forming a second resist layer over said second layer and over said second pattern, said second resist layer having a second via hole therethrough communicating with said second pattern;

forming a second conductive via lead in said second via hole by electrically plating a metal therein, said second conductive via lead being formed in electrical contact with said second pattern;

removing said second resist layer;

forming a third insulative resin layer over said second layer, said second pattern and said second via lead;

etching the surface of said third resin layer at a location adjacent said second via lead to selectively remove the third resin layer until a top segment of said second via lead protrudes to a predetermined height above the etched surface of said third resin layer; and forming a third electrically conductive pattern over said third resin layer and over the protruding segment of said second via lead.

* * * * *

UNITED STATES PATENT AND TRADEMARK OFFICE
CERTIFICATE OF CORRECTION

PATENT NO. : 5,207,865

DATED : May 4, 1993

INVENTOR(S) : Kazuaki Satoh

It is certified that error appears in the above-indentified patent and that said Letters Patent is hereby corrected as shown below:

Title Page, [57] Abstract, line 8, "ar" should be --are--.

Column 2, line 40, after "material" delete the "," and insert --. Layer 2 is formed--;
line 41, after "materials" delete ". Layer 2 is formed" and insert a comma --,--;
line 46, before "by" insert --layer 2--.

Column 3, line 17, "heating" should be --heated--;
lines 42 and 43, "thickness" should be --thicknesses--.
line 57, after "Fig. 2(f)" insert a comma --,--.

Column 4, line 11, change "abovedescribed" to --above-described--;
line 14, after "of" (first occurrence), insert --the--;
line 23, "50" should be --so--;
line 47, ", and third pattern";
line 64, change "laminations however" to --laminations. However--.

UNITED STATES PATENT AND TRADEMARK OFFICE
CERTIFICATE OF CORRECTION

PATENT NO. : 5,207,865

DATED : May 4, 1993

INVENTOR(S) : Kazuaki Satoh

It is certified that error appears in the above-indentified patent and that said Letters Patent is hereby corrected as shown below:

```
Column 5, line 29, "electroplated" should be
                   --electroplating--;
         line 41, "or" should be --are--.
```

Signed and Sealed this

Twenty-fifth Day of January, 1994

Attest:

BRUCE LEHMAN

Attesting Officer      Commissioner of Patents and Trademarks